United States Patent [19]

Bellantoni

[11] Patent Number: 5,300,900
[45] Date of Patent: Apr. 5, 1994

[54] HIGH-FREQUENCY LIMITER AND SWITCH-LIMITER CIRCUIT HAVING IMPROVED RECOVERY TIME

[75] Inventor: John V. Bellantoni, Santa Clara County, Calif.

[73] Assignee: Watkins Johnson Company, Palo Alto, Calif.

[21] Appl. No.: 940,072

[22] Filed: Sep. 3, 1992

[51] Int. Cl.$^5$ .................. H03G 11/04; H04B 3/04
[52] U.S. Cl. .................. 333/17.2; 333/262; 307/317.1; 307/540
[58] Field of Search .................. 333/17.2, 262; 307/317.1, 491, 540

[56] References Cited

U.S. PATENT DOCUMENTS

| | | | |
|---|---|---|---|
| 3,448,414 | 5/1967 | Bronton, III | 333/17.2 |
| 3,959,750 | 5/1976 | Holt | 333/97 |
| 4,232,278 | 11/1980 | Gawronski | 333/13 |
| 4,635,297 | 1/1987 | Polischuk | 455/217 |
| 4,754,240 | 6/1988 | Marconi | 333/81 A |

Primary Examiner—Robert J. Pascal
Assistant Examiner—Darius Gambino
Attorney, Agent, or Firm—Flehr, Hohbach, Test, Albritton & Herbert

[57] ABSTRACT

High-frequency limiter and switch-limiter circuits having reduced insertion loss and improved recovery time are disclosed herein. The high-frequency switch-limiter includes at least one input port and a high-frequency signal path between the input port and a common arm. An input diode generates a first bias current in response to incidence upon the input port of high-energy signals in excess of a predefined power level. A set of protection diodes reflects the high-energy signals upon being switched to an ON state by a portion of the first bias current or by a second bias current, with the protection diodes being disposed to reflect signal energy propagated by the high-frequency signal paths when in the ON state and to pass signal energy propagated by the high-frequency signal paths when in an OFF state. Switching of the protection diodes between the ON and OFF states is expedited by modifying the impedance of a bias network included within a driver network, wherein the driver network is disposed to generate the second bias current in response to a switch control signal.

17 Claims, 11 Drawing Sheets

HIGH-FREQUENCY LIMITER AND SWITCH-LIMITER CIRCUIT HAVING IMPROVED RECOVERY TIME

The present invention relates generally to microwave and other high-frequency communication networks, and particularly to signal-switching and power-limiting circuits used in such networks.

BACKGROUND OF THE INVENTION

Microwave and millimeter wave circuits are extensively employed in, for example, high-frequency satellite communication and radar systems. Receive networks in these and other high-frequency systems generally include sensitive microwave components, such as mixers and low-noise amplifiers, for detecting transmitted microwave or millimeter wave signals. In order to protect these components from high-power signals (e.g., radar jamming signals) incident on a receive antenna, power-limiting circuits are often interposed in series between the antenna and the receiver. Microwave and millimeter wave limiters are designed to present a characteristic transmission line impedance with minimal insertion loss when signals of ordinary magnitude are being received by the antenna. In contrast, high-power signals impinging on the antenna cause the limiter to approximate a short circuit, thereby preventing damage to sensitive components within the receiver.

In high-frequency systems having an array of antenna input ports, switches are used to select or distribute microwave signals. Microwave switches may be employed to, for example, couple a main signal path or "common arm" to the limiter circuit associated with a particular antenna. Each antenna input port is typically followed by the cascade connection of a limiter circuit and a switching element. The term switch-limiter is often used to describe such a cascade connection.

FIG. 1 is a schematic representation of a conventional limiter circuit driven by a Schottky diode D1 positioned proximate a high-power input port. The input port will generally be in communication with an antenna, and also serves as the origin of a high-frequency signal path P. The signal path P will typically be realized as microstrip or stripline, with the diode D1 and a bypass capacitor C2 being coupled to the signal path P by a quarter-wave coupler Q. The position of the quarter-wave coupler Q relative to the signal path P may be varied so as to adjust the coupling between the diode D1 and the signal path P. Since the diode D1 is turned on in response to high-frequency signal energy of known power, the coupler Q may be positioned such that the diode D1 is actuated when signal energy in excess of a predefined power impinges upon the input port. In this way the limiter may be calibrated so as to present a short-circuit to signal energy of predetermined magnitude received by the input port.

More specifically, when a high-power pulse exceeding the requisite magnitude appears at the input port the diode D1 is turned on by high-frequency signal energy supplied thereto by the coupler Q. Upon being turned on the diode D1 generates a DC bias current, which is supplied to PIN diodes D3, D4 and D5 through a bias structure. The bias structure includes resistor R1, RF choke inductor L1 and capacitor C3. Since the bias current turns on diodes D3, D4 and D5, several high-frequency short circuits are created between the signal path P and ground. In this way the high-power pulse is reflected first by the short circuits at parallel-connected PIN diodes D3 and D4, while diode D5 reflects pulse energy able to bypass diodes D3 and D4 along signal path P. Attenuation of high-power signals between the input port and the protected output port will generally be maximized by spacing diode D5 from diodes D3 and D4 by a quarter-wavelength of the center frequency transmitted by the path P.

As is evident from FIG. 1, the bias current supplied by diode D1 to diodes D3, D4 and D5 when a high-power pulse is incident upon the input port depends upon the magnitude of R1. Large values of R1 allow a relatively greater percentage of the bias current from the Schottky diode D1 to be supplied to the diodes D3, D4, and D5, while smaller values of R1 result in increased dissipation of bias current. Accordingly, power-handling capability is improved by augmenting the resistance R1 such that the bias current generated by diode D1 is predominantly used to energize the diodes D3, D4 and D5.

The advantages of Schottky driven limiters such as that shown in FIG. 1 include high power-handling capability (e.g., 2 kW for a 1 μs pulse or 50 W continuous-wave), an adjustable limiting threshold provided by coupler Q, and the absence of a requirement that the parameters of the PIN diodes D3, D4 and D5 be matched.

Unfortunately, Schottky limiters are known to have relatively long recovery times, where recovery time is defined as the time required for the limiter to return to a low-loss state subsequent to the end of a high-power pulse. Upon cessation of the high-power pulse, diode D1 turns off and terminates the supply of bias current to diodes D3, D4 and D5. This allows the PIN diodes D3, D4 and D5 to return to a non-conducting (i.e., "insertion-loss") state after residual charge stored in the intrinsic regions thereof is removed. While in the insertion-loss state the diodes D3, D4, and D5 appear essentially as open-circuits to signal energy propagating along the path P, and hence allow low-power signals to pass between the input and protected ports. However, diodes D3, D4 and D5 behave as open circuits only after the residual charge stored within each is completely removed subsequent to the diminution, or "limiting", of a high-power pulse. It follows that the diodes D3, D4 and D5 undesirably reflect a portion of low-power signal energy for a characteristic "recovery" time subsequent to incidence of a high-power pulse, thereby undesirably increasing overall insertion loss (i.e., signal attenuation).

As may be appreciated by referring to FIG. 1, the recovery time required for the diodes D3, D4 and D5 to return to the insertion loss state following incidence of a high-power pulse is inversely proportional to the magnitude of R1. Hence, small values of R1 shorten recovery time, while large values of R1 increase recovery time. However, small values of R1 result in larger fractions of the bias current from diode D1 being diverted to ground, thereby reducing the power-handling capability of the PIN diodes D3, D4 and D5. As a consequence, designers of conventional limiters are typically forced to strike a compromise between power-handling and recovery time when selecting the resistance value of R1.

As noted above, the conventional limiter of FIG. 1 is typically cascaded in series with a high-frequency switching circuit in order to form a switch-limiter circuit. Since switching circuits also generally include a pair of quarter-wave spaced diodes, such composite switch-limiter circuits will often incorporate at least four PIN diodes connected in shunt with the high-frequency signal path. Unfortunately, this redundancy undesirably increases the insertion loss of conventional switch-limiter circuits, which in turn tends to limit the range of the antenna system in which the switch-limiter is disposed.

OBJECTS OF THE INVENTION

It is an object of the present invention to provide a limiter circuit in which recovery time subsequent to incidence of a high-power pulse may be decreased without causing an accompanying decrease in power-handling capability.

It is a further object of the present invention to provide a limiter circuit having reduced insertion loss when guiding low-power RF signals.

It is another object of the present invention to provide a switch-limiter circuit having both reduced insertion loss and shorter recovery time.

SUMMARY OF THE INVENTION

In summary, the present invention provides high-frequency limiter and switch-limiter circuits having reduced insertion loss and improved recovery time. The high-frequency switch-limiter includes at least one input port and a high-frequency signal path between the input port and a common arm. An input diode generates a first bias current in response to incidence upon the input port of high-energy signals in excess of a predefined power level. A set of protection diodes reflects the high-energy signals upon being switched to an ON state by a portion of the first bias current or by a second bias current, with the protection diodes being disposed to reflect signal energy propagated by the high-frequency signal paths when in the ON state and to pass signal energy propagated by the high-frequency signal paths when in an OFF state. Switching of the protection diodes between the ON and OFF states is expedited by modifying the impedance of a bias network included within a driver network, wherein the driver network is disposed to generate the second bias current in response to a switch control signal.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT LIMITER CIRCUIT

Figure 2:
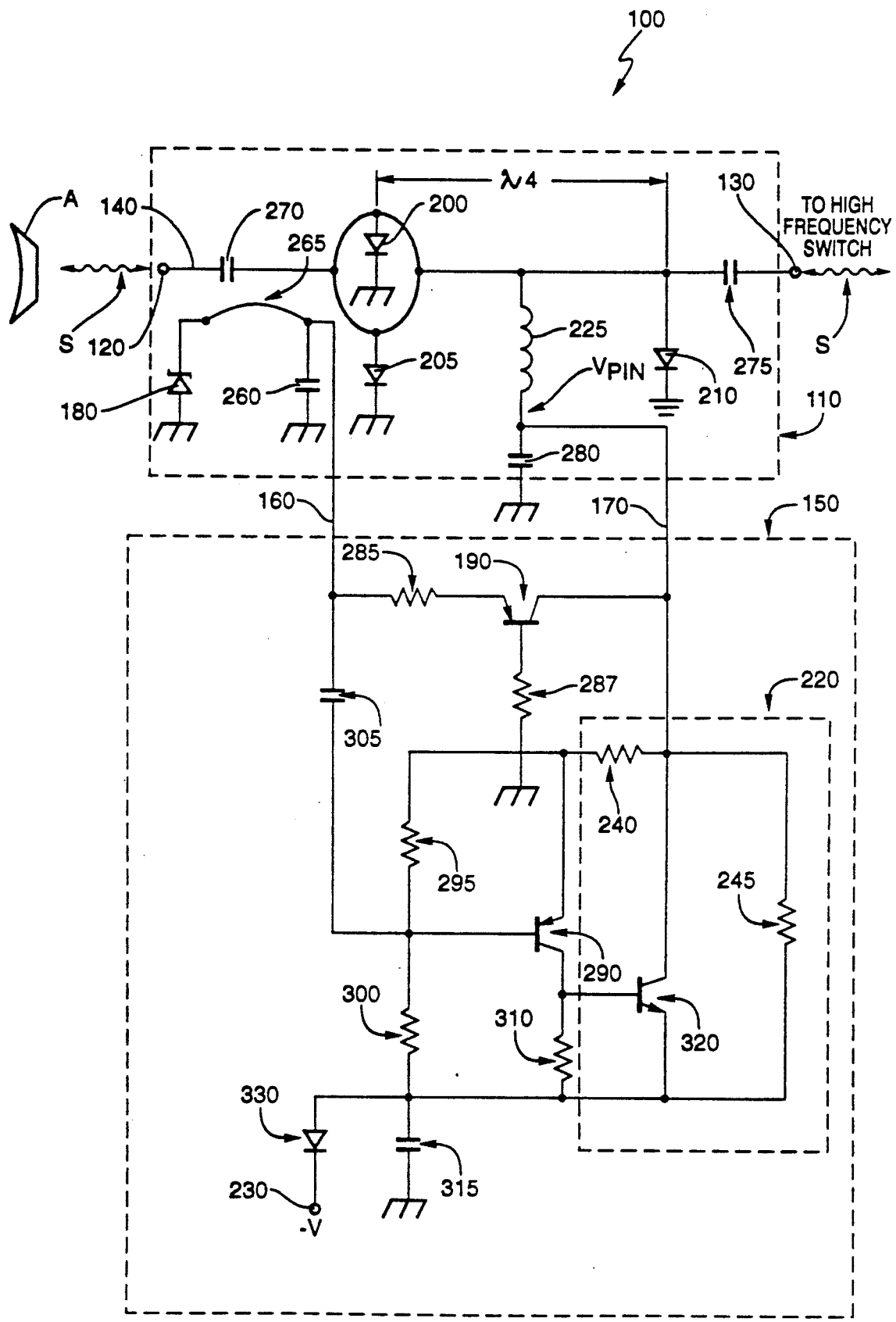
FIG. 2 is a schematic representation of a preferred embodiment of the high-frequency limiter of the present invention having improved insertion loss and recovery time.

FIG. 2 is a schematic representation of a preferred embodiment of the high-frequency limiter 100 of the present invention having improved insertion loss and recovery time. The limiter 100 includes a high-frequency, or "RF", circuit 110 capable of supporting bidirectional propagation of RF signal energy S, such as microwave or millimeter wave signals, between a high-power input port 120 and a protected port 130. The input port 120 and protected port 130 of RF circuit 110 are linked by a high-frequency transmission line 140 typically implemented in either microstrip or stripline. The input port 120 will often be operatively coupled to an antenna A, while the protected port 130 will generally be connected to a high-frequency switch (not shown).

The inventive limiter 100 further includes a DC driver circuit 150 connected to the RF circuit 110 by first and second DC bias lines 160 and 170. As is described more fully below, the limiter 100 is designed to isolate input port 120 from protected port 130 upon incidence of a high-power pulse upon input port 120. In the absence of a high-power pulse the RF circuit 110 is biased by DC driver circuit 150 via DC bias line 170 so as to allow low-power RF signals to pass substantially unimpeded between input port 120 and protected port 130.

Incidence of a high-power pulse of sufficient magnitude upon input port 120 causes Schottky diode 180 to supply a DC bias current on the first DC bias line 160 to the DC driver circuit 150. The DC bias current on line 160 turns on PNP isolating transistor 190, which allows the DC bias current to charge first and second parallel connected PIN diodes 200 and 205 as well as a secondary PIN diode 210. During incidence of such high-power pulses the impedance of a bias network 220 included within the DC driver network 150 is made to be large relative to the low-frequency impedance of PIN diodes 200, 205 and 210 within the RF circuit 110. This results in a relatively large percentage of the DC bias current generated by the Schottky diode 180 being supplied to the PIN diodes 200, 205 and 210 rather than being dissipated in the bias network 220. It is observed that high-power signals will be attenuated even in the absence of provision of the voltage $-V$ at the supply node 230, since the PIN diodes 200, 205 and 210 are energized with current from the Schottky diode 180. In this way the power-handling capability of the PIN diodes 200, 205 and 210 is assured of being relatively large even in the event of, for example, a power failure resulting in loss of the bias voltage −V.

Figure 1:
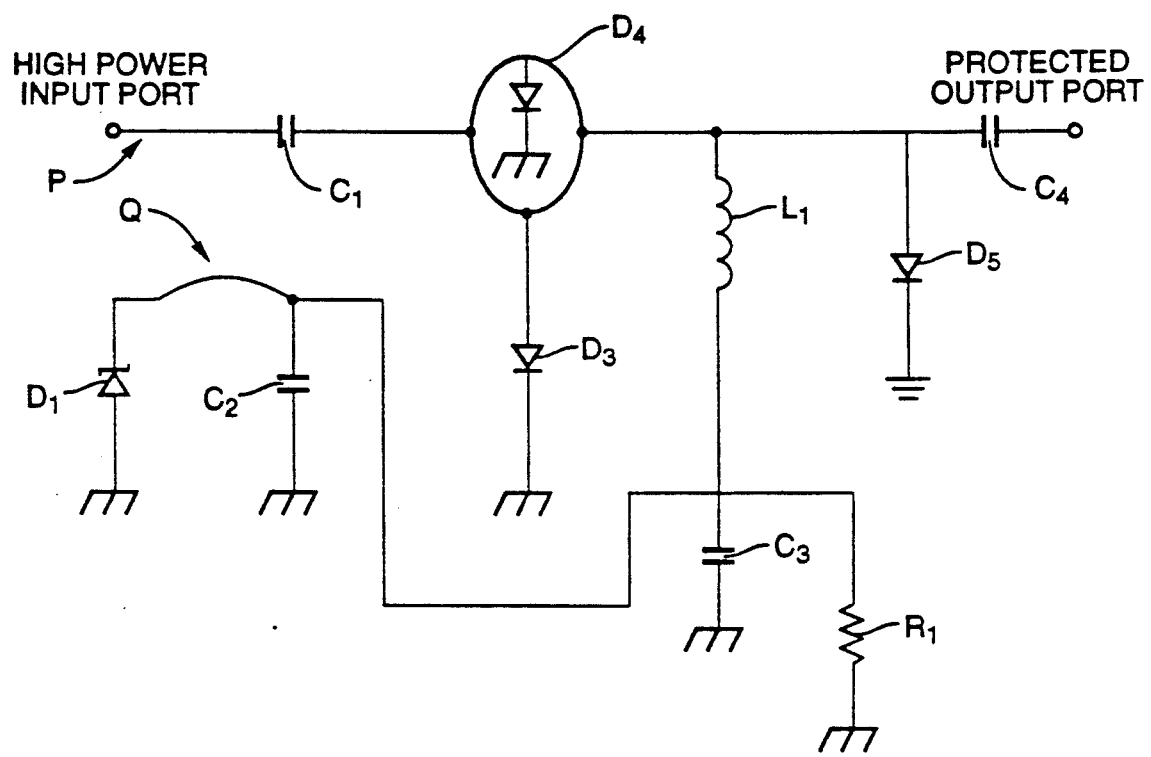
FIG. 1 is a schematic representation of a conventional Schottky-driven limiter circuit.

At the conclusion of a high-power pulse, the driver 150 operates to switch the impedance of the bias network 220 to essentially that of a short circuit. This effectively couples the voltage −V at negative supply node 230 to the second DC bias line 170, thus expediting the removal of charge from the intrinsic regions of the PIN diodes 200, 205, and 210. In this way the recovery time required for the inventive limiter 100 to return to a low-impedance insertion loss state is decreased relative to that required by the conventional Schottky-driven limiter depicted in FIG. 1.

While in the low-impedance state the RF circuit 110 is coupled to the negative supply voltage −V through a voltage divider within the bias network 220 consisting of first and second bias transistors 240 and 245. In this way the PIN diodes 200, 205 and 210 are coupled to a negative potential while the RF circuit 110 is in the low-impedance state, thus causing the insertion loss of the inventive limiter 100 to be less than that of the conventional limiter shown in FIG. 1.

Figure 3:
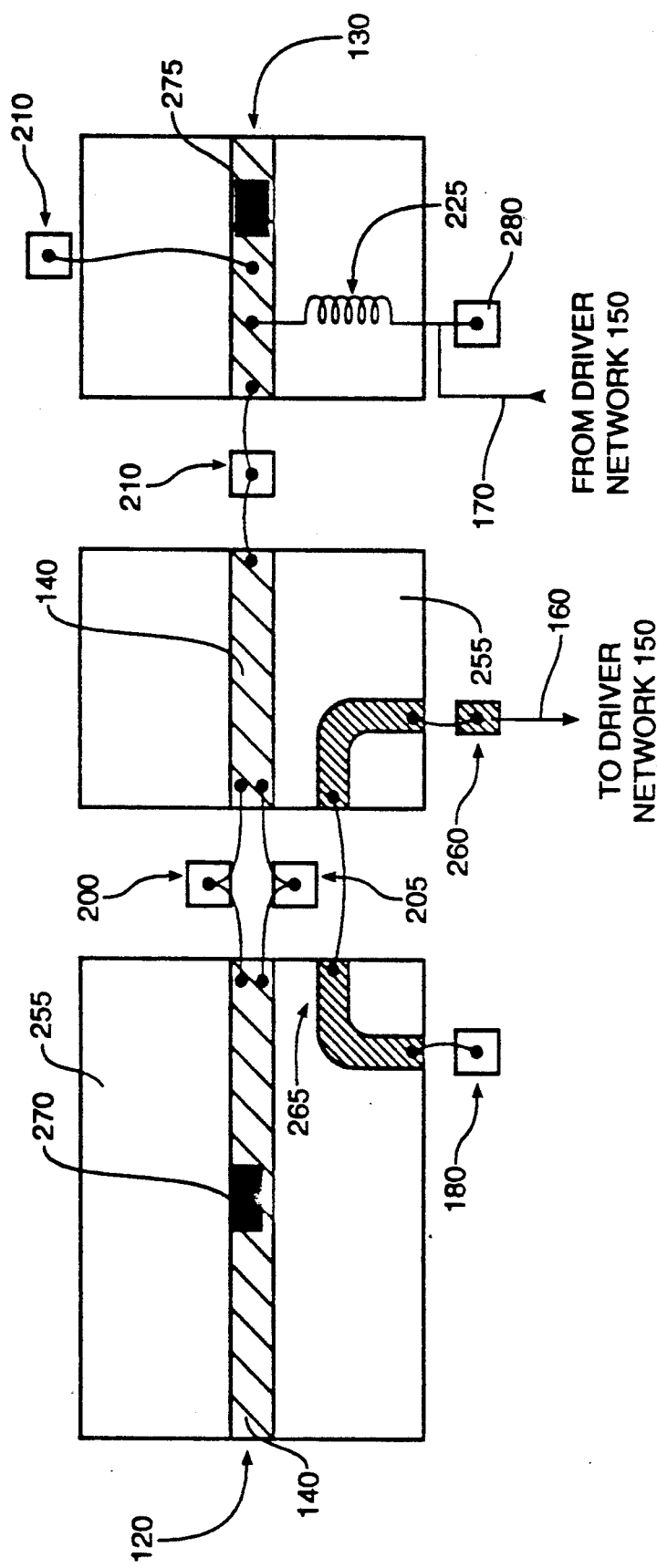
FIG. 3 shows a top view of a microstrip implementation of a high-frequency RF circuit included within the inventive limiter.

Referring to FIG. 3, there is shown a top view of a microstrip implementation of the RF circuit 110. The high-frequency signal path 140 originates at input port 120, and will generally be coupled from the center pin of a coaxial antenna feed line (not shown). The signal path 140 is realized using a conventional microstrip transmission line which includes, for example, a thin deposition of a conductor such as gold upon an alumina substrate material 255. The Schottky diode 180 and a first bypass capacitor 260 are coupled to the signal path 140 through an octave bandwidth quarter-wave coupler 265. The coupling between the signal path 140 and the diode 180 is controlled by adjusting a distance D separating a quarter-wave transmission line segment 267 of the coupler 265 from the signal path 140. The length of the transmission line segment 267 is approximately one quarter of a center wavelength at which the limiter 100 is designed to operate. If, for example, it is desired that the diode 180 be turned on in response to high-power pulses of approximately 40 dBm, the distance D between the signal path 140 and transmission line segment 267 would be adjusted so as to engender approximately 25 to 35 dicibels (dB) of coupling. The DC bias current generated by the Schottky diode 180 proceeds through the transmission line segment 267 to the first DC bias line 160.

As is indicated in FIG. 3, the PIN diodes 200, 205 and 210 are protected from DC voltages and current impressed upon signal path 140 by first and second DC blocking capacitors 270 and 275. The PIN diodes 200, 205 and 210 are each conventionally wire-bonded to the signal path 140, with the Schottky diode 180 and first bypass capacitor 260 also being wire-bonded to the transmission line segment 267 of quarter-wave coupler 265. In addition, the RF choke inductor 225 is wire-bonded to the signal path 140 and to a second bypass capacitor 280.

Figure 4:
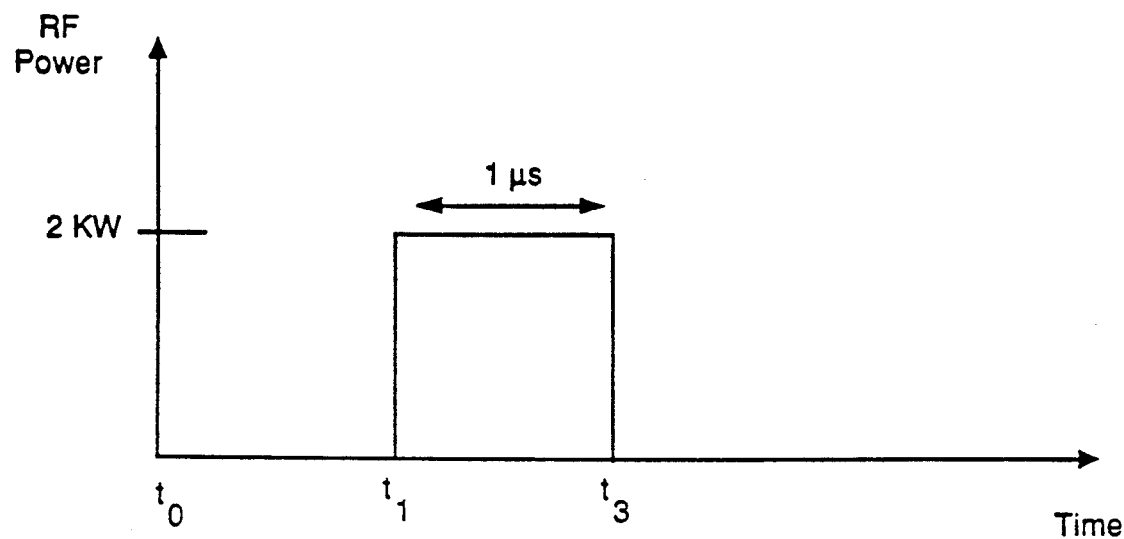
FIG. 4 is a timing diagram depicting a 2 kW pulse of RF energy having a duration of approximately 1 microsecond ($\mu s$).
Figure 5:
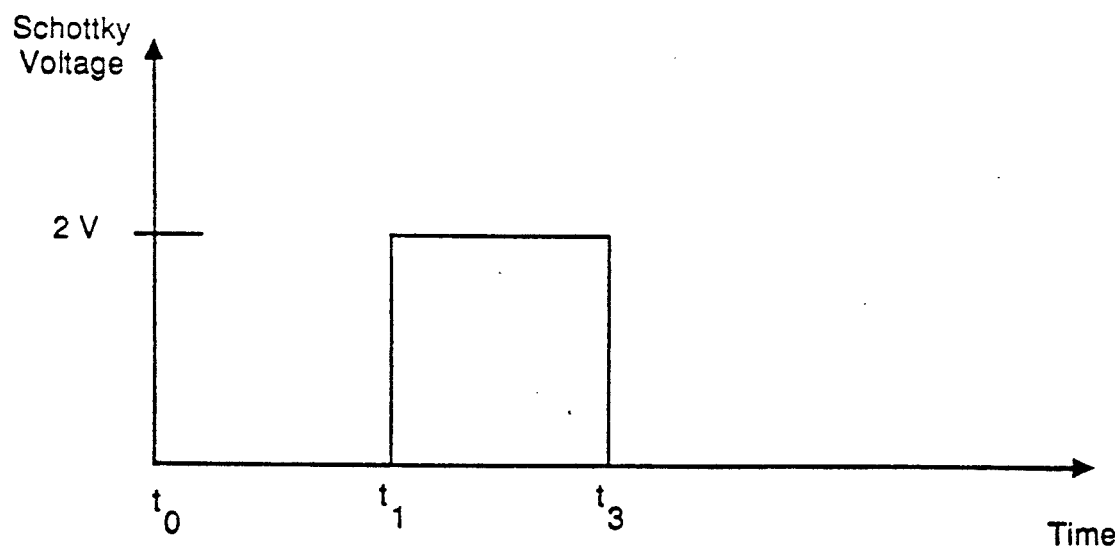
FIG. 5 is a timing diagram showing the manner in which a Schottky diode included within the RF circuit is turned on and off nearly contemporaneously with the rise and fall of the RF pulse.

The operation of the limiter circuit 100 may be conveniently described with reference to the timing diagrams of FIGS. 4-9. As is illustrated in FIG. 4, a pulse of RF energy having a power of 2 kW and a duration of approximately 1 microsecond ($\mu$s) is incident upon the input port 120 of the RF circuit 110 at a time $t_1$. Assuming the quarter-wave coupler 265 is designed to provide a standard degree of coupling (e.g., 25 to 35 dB) the Schottky diode 180 will be turned on and off nearly contemporaneously with the rise and fall of the RF pulse at times $t_1$ and $t_3$ (FIG. 5). In the embodiment of FIGS. 2 and 3 the diode 180 will preferably be selected so as to develop a voltage of approximately 2 V and a bias current on the order of 80 mA when presented with an equivalent impedance of approximately 25 ohms.

Figure 6:
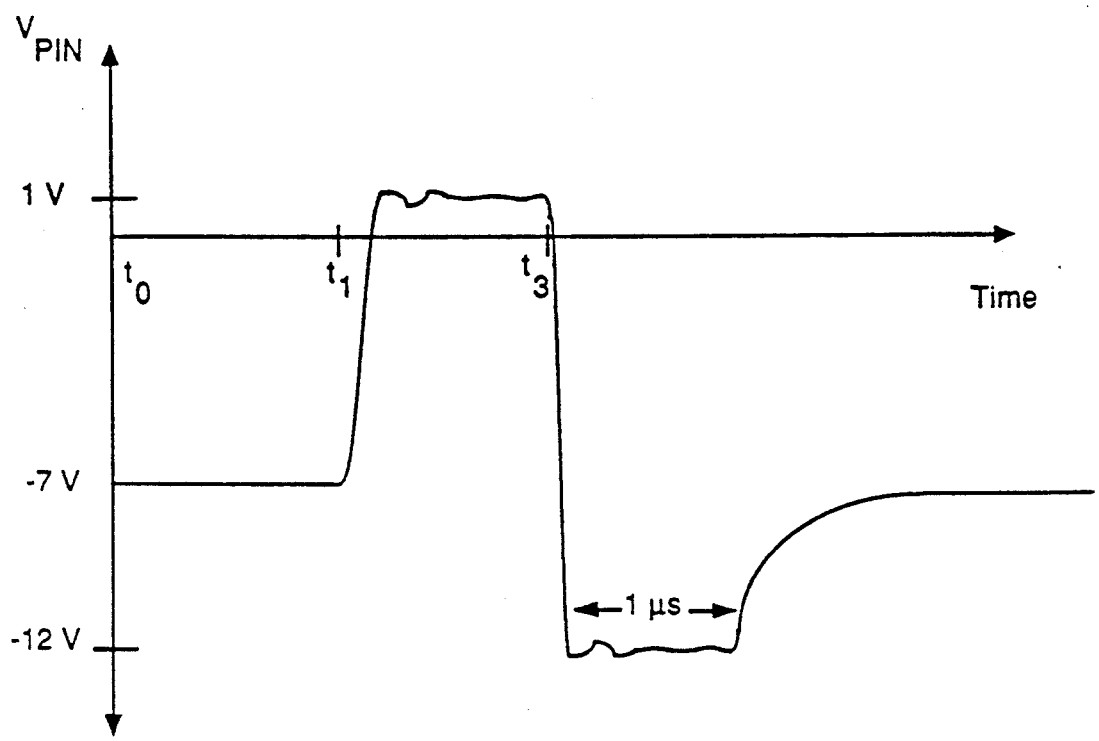
FIG. 6 is a timing diagram representative of a bias voltage Vpin applied to a set of PIN diodes included within the RF circuit.

Referring to FIG. 2 and to the timing diagram of FIG. 6, during the low-impedance insertion loss state between times $t_0$ and $t_1$ the bias voltage Vpin applied to the PIN diodes 200, 205 and 210 via DC bias line 170 is set at approximately −7 V by the first and second bias resistors 240 and 245 (assuming a negative supply voltage at node 230 of −12 V). It is noted that the negative value of the PIN diode bias voltage Vpin during operation in the low-impedance state reduces the insertion loss caused by the PIN diodes 200, 205 and 210 relative to that induced by the PIN diodes in the limiter of FIG. 1, since the PIN diodes in the conventional limiter are nominally held at a potential of approximately zero volts. That is, application of a reverse bias to the PIN diodes 200, 205 and 210 increases the impedance of each, thereby reducing insertion loss, by more completely removing charge stored therein.

At time $t_1$ the bias current generated by Schottky diode 180 turns on isolation transistor 190. As shown in FIG. 2, transistor 190 has an emitter terminal coupled to the diode 180 through a driver input resistor 285 and a base terminal connected to a grounded resistor 287. The bias current conducted by transistor 190 creates a high-frequency short circuit across PIN diodes 200, 205 and 210, and charges the second bypass capacitor 280 so as to raise Vpin to approximately 1 V. As is discussed below with reference to FIG. 7, the short-circuited PIN diodes 200, 205 and 210 operate to reflect the high-power pulse incident on the input port 120.

Figure 7:
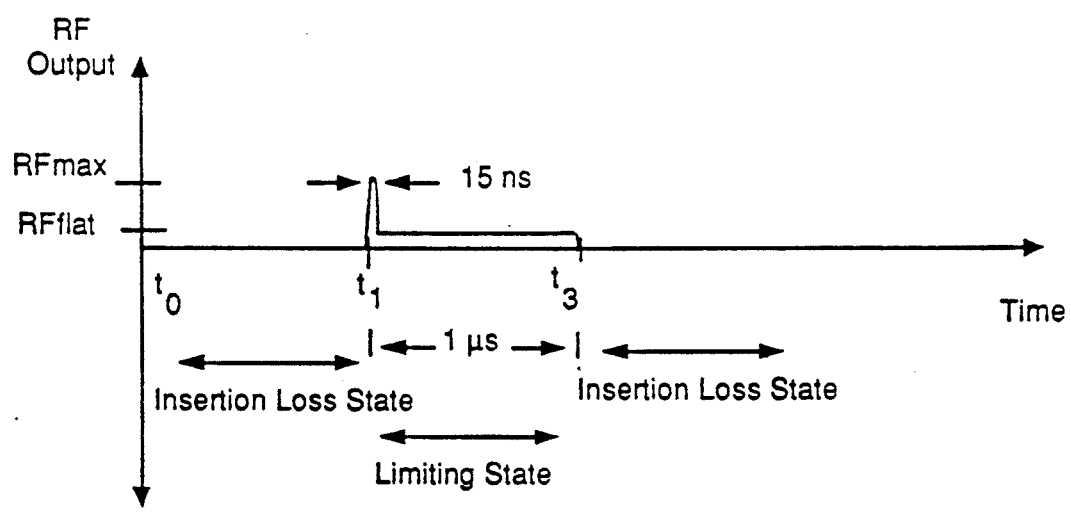
FIG. 7 shows a timing diagram depicting the amount of power from the RF pulse which impinges upon a protected port of the RF circuit.

Referring to the timing diagram of FIG. 7, the inventive limiter 100 allows only minimal RF pulse energy to impinge upon the protected port 130. Specifically between times $t_1$ and $t_2$ the RF power appearing at protected port 130 will temporarily rise to a value of RFmax (e.g., 35 dBm) while the third PIN diodes 210 is in the process of turning on. Diode 210 will generally be selected to have a more rapid turn-on time, and hence lower power-handling capability, than the first and second PIN diodes 200 and 205. As a consequence, the third PIN diode 210 prevents the power of RF pulse energy from exceeding RFmax while the first and second PIN diodes are being charged by the DC bias current. The isolation provided by the PIN diodes will generally be maximized by maintaining quarter-wavelength spacing between the third PIN diode 210 and the first and second PIN diodes 200 and 205. Between times $t_2$ and $t_3$ the limiter 100 operates to prevent in excess of a flat leakage level of RF power (e.g., RFflat = 10 dBm) from reaching the protected port 130.

Figure 8:
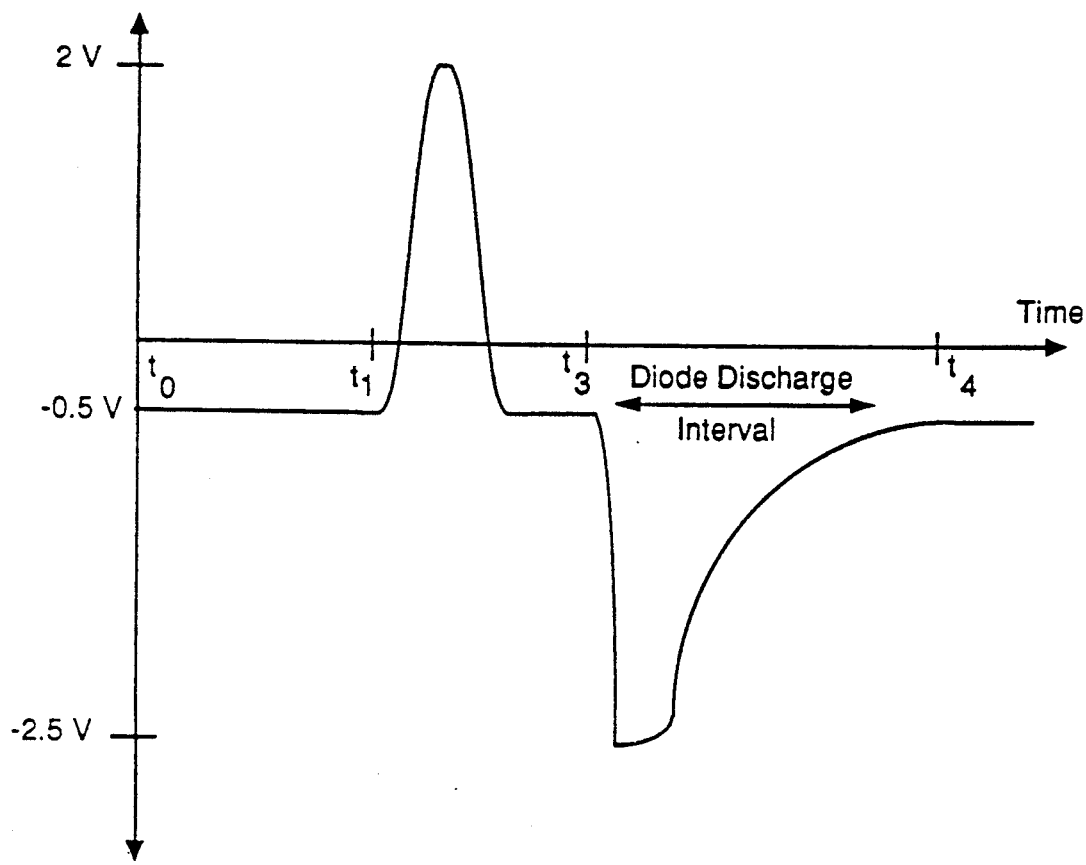
FIG. 8 is a timing diagram depicting the voltage at the base of a PNP switching transistor connected to a DC bias network.

FIG. 8 is a timing diagram depicting the voltage at the base of the PNP switching transistor 290. Referring to FIGS. 2 and 8, third and fourth bias resistors 295 and 300 maintain a PNP switching transistor 290 at just below cut-off by holding the base thereof at approximately −0.5 Volts during the insertion-loss state between times $t_0$ and $t_1$. At time $t_1$ the DC bias current supplied by the Schottky diode 180 charges a coupling capacitor 305, which causes the base of transistor 290 to temporarily rise to approximately 2 V. Transistor 290 remains turned of until cessation of the RF pulse at time $t_3$, at which time the voltage across the Schottky diode 180 drops from approximately 2 V to 0 V. This change forces the voltage held by capacitor 305 to dissipate as base-emitter current through transistor 190, which results in saturation transistor 320. In this way transistor 290 is turned on during a diode discharge interval between times $t_3$ and $t_4$, thus forcing collector current thereof through a turn-on resistor 310 connected across the base-emitter junction of pull-down transistor 320. The current through the resistor 310 results in turn-on of the pull-down transistor 320 by raising the base-emitter voltage thereof to a saturation value, generally approximately 0.75 V above the value of the negative voltage impressed on filter capacitor 315. Once turned on the transistor 320 effectively creates a short circuit between the second bypass capacitor 280 and a reverse protection diode 330, and thus pulls down the PIN diode bias voltage Vpin to the negative supply voltage (−12 V) for approximately 1 μs subsequent to time $t_3$ (FIG. 6). Since the isolation transistor 190 turns off during the drop in the Schottky voltage from 2 V to 0 V, the Schottky diode is protected from the negative supply voltage by isolation transistor 190 during the diode discharge interval between times $t_3$ and $t_4$ (FIG. 8).

Figure 9:
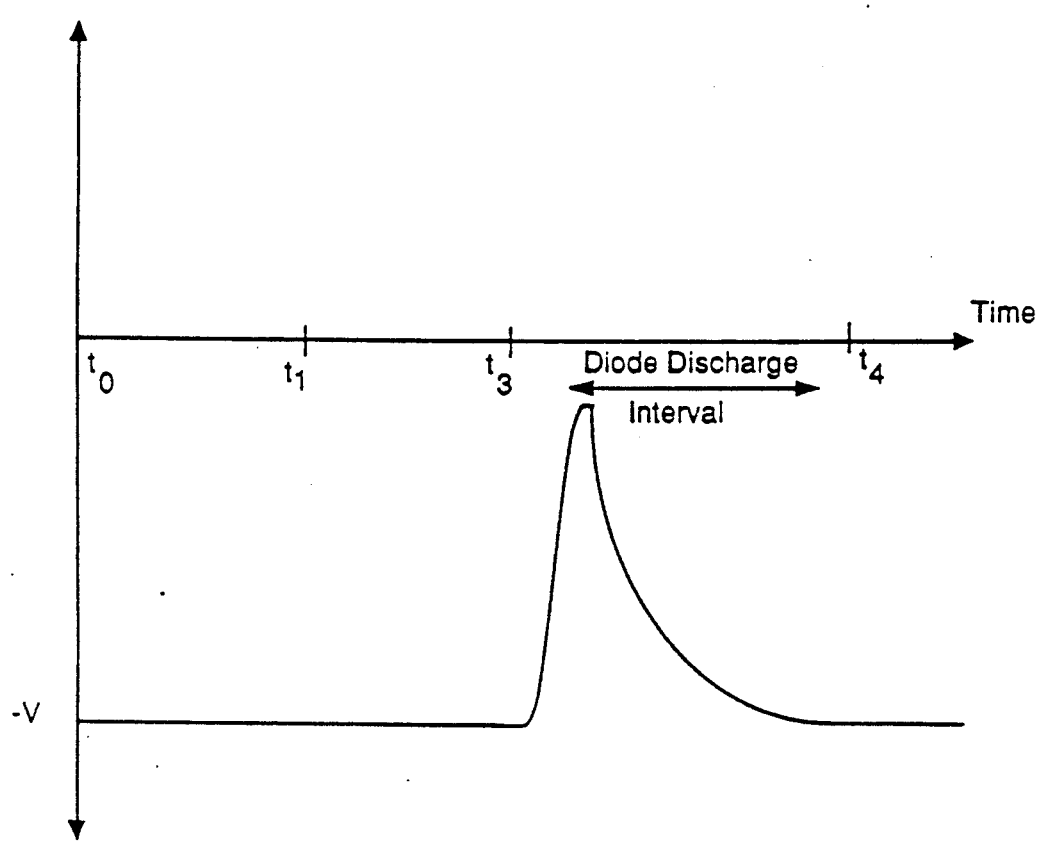
FIG. 9 is a timing diagram showing the variation in the base voltage of a pull-down transistor included within the DC bias network.

The large negative potential of Vpin at the end of the RF pulse (time $t_3$) significantly reduces the recovery time of the PIN diodes 200, 205 and 210 by expediting the removal of the charge stored by each. As is shown in the timing diagram of FIG. 8, the voltage at the base of the switching transistor 290 discharges during the diode discharge interval in accordance with an RC time constant proportional to the value of the coupling capacitor 305 and the equivalent resistance seen thereby. At the conclusion of the diode discharge interval (time $t_4$) the charge stored by the coupling capacitor 305 during incidence of the high-power RF pulse has been completely dissipated. This discharge of capacitor 305 turns off transistor 290 by sufficiently raising the base voltage thereof, which results in pull-down transistor 320 also being turned off by the end of the diode discharge interval. The timing diagram of FIG. 9 depicts the rise and fall of the base voltage of the pull-down transistor 320 during the diode discharge interval.

The following table identifies the specific electrical components used in a preferred implementation of the inventive limiter 100, with the entries below the column heading "Ref#" corresponding to the reference numerals in FIGS. 2-3.

TABLE I

| Ref # | Component | Manufacturer | Part # |
|---|---|---|---|
| 180 | Schottky Diode | Alpha Industries, Inc. | CDB7605 |
| 205 | PIN Limiter Diode | Alpha Industries, Inc. | CLA3133-01 |
| 200 | PIN Limiter Diode | Alpha Industries, Inc. | CLA3133-01 |
| 210 | PIN Limiter Diode | Alpha Industries, Inc. | CLA3132-01 |
| 330 | Rectifier Diode | Motorola, Inc. | 1N4001 |
| 190 | PNP Transistor | Motorola, Inc. | 2N4209 |
| 320 | NPN Transistor | Motorola, Inc. | 2N2369A |
| 290 | PNP Transistor | Motorola, Inc. | 2N4209 |
| 240 | 5K Ohm Resistor | Mini-Systems, Inc. | 110-50000F-0001 |
| 285 | 10 Ohm Resistor | Mini-Systems, Inc. | 110-10R00J-0000 |
| 295 | 2K Ohm Resistor | Mini-Systems, Inc. | 110-20000F-0001 |
| 287 | 350 Ohm Resistor | Mini-Systems, Inc. | 110-350R0F-0001 |
| 300 | 40K Ohm Resistor | Mini-Systems, Inc. | 110-40001F-0001 |
| 245 | 5K Ohm Resistor | Mini-Systems, Inc. | 110-50000F-0001 |
| 310 | 350 Ohm Resistor | Mini-Systems, Inc. | 110-350R0F-0001 |
| 225 | 18 nH Inductor | Microwave Components, Inc. | 6-1847-GA |
| 270 | 15 pF Capacitor | Dielectric Labs., Inc. | D20BG150K1PX |
| 260 | 15 pF Capacitor | Dielectric Labs., Inc. | D20BG150K1PX |
| 280 | 15 pF Capacitor | Dielectric Labs., Inc. | D20BG150K1PX |
| 275 | 15 pF Capacitor | Dielectric Labs., Inc. | D20BG150K1PX |
| 305 | 100 pF Capacitor | Dielectric Labs., Inc. | D20BG101K1PX |
| 315 | 0.1 uF Capacitor | Johanson Dielectric, Inc. | 500S41X7R104KP |

Octave-Band Switch-Limiter

Figure 10:
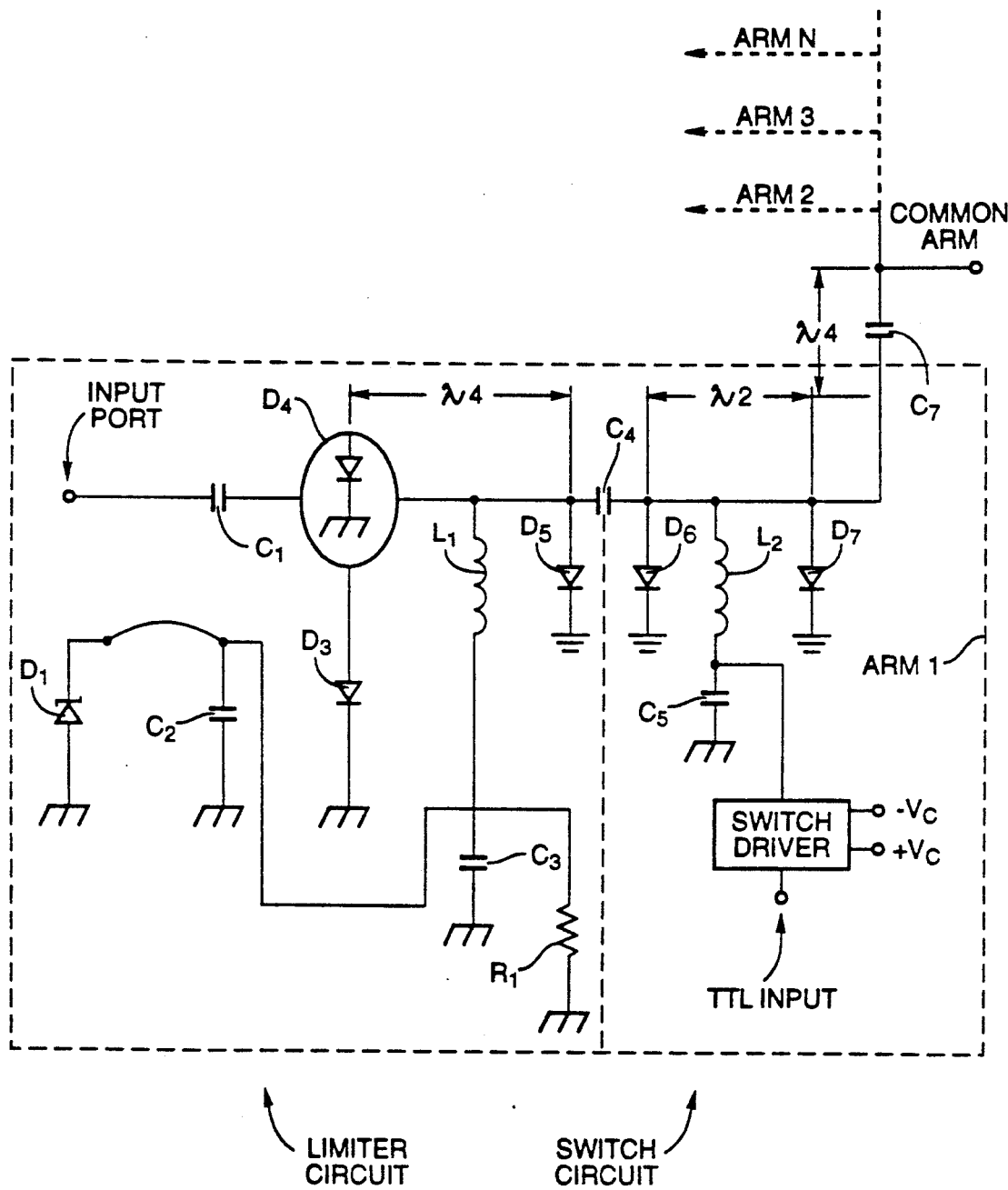
FIG. 10 shows a schematic representation of a conventional octave-band switch-limiter circuit.

FIG. 10 shows a schematic representation of a conventional octave-band switch-limiter circuit. The switch-limiter of FIG. 10 includes N high-frequency signal paths (branch arms) capacitively coupled by capacitor C7 to a common arm. Since each of the N branch arms will typically be substantially identical, only branch arm 1 is shown in detail in FIG. 10. Each branch arm will generally be in communication with an antenna (not shown) through an input port of a limiter circuit such as that described with reference to FIG. 1. As shown in FIG. 10, the limiter circuit of branch arm 1 is linked by a switch circuit to the common arm.

The switch circuit of each branch arm operates to selectively isolate the input port of the branch arm from the common arm when the appropriate control voltage +Vc is supplied by a TTL switch driver. Conversely, each switch circuit connects the input port of a particular arm to the common arm in response to a control voltage of −Vc provided by the switch driver. In this way the common arm may be simultaneously coupled to a desired branch arm and isolated from all others by instructing the switch driver within each to generate either the control voltage +Vc or −Vc.

Each switch circuit includes a pair of quarter-wave spaced PIN diodes D6 and D7, with the diode D7 also being positioned one quarter of the center operating wavelength λ from the common arm. Application of the positive control voltage +Vc to the diodes D6 and D7 through inductor L2 and capacitor C5 creates a forward bias across each, which makes diodes D6 and D7 appear as a short circuit to RF signal energy. As is well-known, the presence of the RF short circuit provided by forward-biased diode D7 at a distance λ/4 from the common arm results in the quarter-wave section of transmission line between diode D7 and the common arm approximating an open circuit. The quarter-wave transmission line section between the forward-biased diodes D6 and D7 provides further isolation between the common arm and the input port of each branch arm.

As may be apparent from the foregoing, the high-frequency isolation provided by the switch circuit within each branch arm is dependent upon component spacing of one quarter of a center operating wavelength. Accordingly, the isolation provided by the switch circuit within each branch arm is reduced when the operating frequency of the switch limiter deviates from the center frequency, and is of minimal magnitude over operating frequencies larger than twice the center frequency or less than one-half of the center frequency. That is, the switch-limiter circuit of FIG. 10 is designed to operate over an octave bandwidth encompassing a desired center operating frequency.

Although the conventional switch-limiter circuit of FIG. 10 is capable of providing suitable isolation between the common arm and selected input ports of the branch arms over a selected bandwidth, it is noted that each branch arm includes five PIN diodes D3-D7. As mentioned above, each PIN diode increases the insertion loss of the switch-limiter when the switch circuit of a particular branch arm is biased so as to allow low-power RF signal energy to pass between the input port thereof and the common arm. Such insertion loss is undesirable since, for example, it attenuates the strength of low-power RF signals propagating from the input port of one of the branch arms to the common arm. As is discussed below with reference to FIG. 11, the switch-limiter circuit of the present invention minimizes insertion loss by reducing the number of PIN diodes required to be incorporated within each branch arm.

Figure 11:
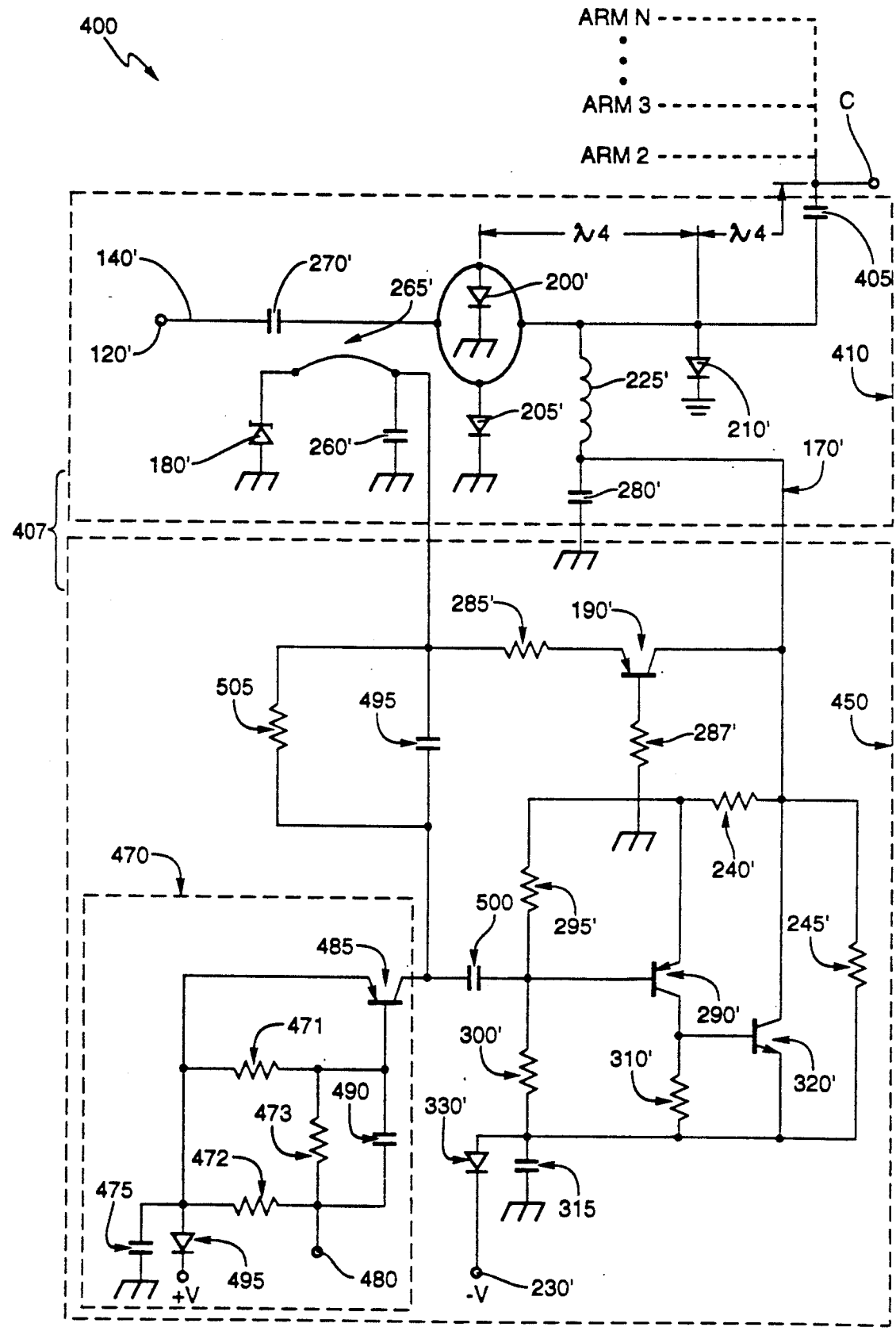
FIG. 11 illustratively represents a preferred embodiment of the inventive switch-limiter circuit.

Referring to FIG. 11, a preferred embodiment of the inventive switch-limiter circuit 400 includes N identical branch arms coupled to a common arm C by a DC-blocking capacitor 405. The first branch arm 407 includes an octave-band RF circuit 410 interposed between the common arm C and an antenna (not shown), wherein the octave-band RF circuit 410 is substantially identical to the RF circuit 110 included within the limiter 100 of FIG. 2. The first branch arm 407 further includes an AC-coupled switch-driver 450, a portion of which is identical to the DC driver 150 (FIG. 2). Accordingly, the reference numerals of FIG. 2 will be employed in conjunction with an apostrophe to identify those electrical components common to the limiter 100 and to the switch-limiter 400.

The octave-band RF circuit 410 included within branch arm 407 is disposed to perform both limiting and switching functions. The RF circuit 410 operates as a limiter by reflecting high-power RF pulses incident upon input port 120', and operates as a switch to selectively isolate input port 120' from the common arm C when supplied with the requisite bias current from the switch-driver 450. The switch-driver 450 serves to provide a DC bias current to the PIN diodes 200', 205' and 210' upon incidence of high-power pulses at the input port 120', and also when it is desired to isolate the input port 120' from the common arm C. The switch-driver 450 thus allows the three PIN diodes 200', 205' and 210' to be utilized both as limiting and as switching elements. It follows that the insertion loss of the inventive switch-limiter 400 will generally be less than that of the conventional switch-limiter of FIG. 10, given that the latter requires five PIN diodes.

Referring to FIG. 11, the third PIN diode 210' is spaced a quarter-wavelength from the common arm C, and the first and second PIN diodes 200' and 205' are located a quarter-wavelength from the third PIN diode 210'. It follows that arm 407 will appear as an open circuit to the common arm C when the PIN diodes are forward-biased to create high-frequency short circuits. As shown in FIG. 11, a TTL switch control network 470 operates to induce the switch driver 450 to forward bias the diodes 200', 205' and 210', and thereby isolate the common arm C from the input port 120', when a TTL logical low (i.e., zero volts) is impressed on TTL switch control node 480.

The switch control network 470 includes a voltage divider consisting of first, second and third divider resistors 471, 472 and 473, with the first and second resistors being commonly connected to a power supply capacitor 475. The control node 480 is coupled to the base of a PNP switch-control transistor 485 through a switching capacitor 490. Application of a logical low to control node 480 turns on transistor 485 by pulling the base below the emitter thereof, since the latter is connected to a positive supply voltage +V (e.g., 5 V) through a supply diode 495. Upon being turned on, transistor 485 directly charges primary and secondary coupling capacitors 495 and 500, and forces current through the isolation transistor 190' via a bypass resistor 505 and switch-driver input resistor 285'. As a consequence, transistor 190' is turned on and creates high-frequency short-circuits across the PIN diodes 200', 205' and 210' by supplying the requisite DC bias current. In this way the application of a TTL logical low to switch control node 480 results in a high-frequency open circuit being developed between the common arm C and the input port 120'.

When the voltage applied to the switch control node is changed from a TTL logical low to a TTL logical high (e.g., 5 V), the switch control transistor 485 becomes turned off since the base and emitter thereof are held at approximately the same voltage. Turn-off of transistor 485 precipitates the same type of base-emitter saturation in switch transistor 290' as would occur at the conclusion of incidence of a high-power RF pulse upon the input port 120' (see FIG. 8). Transistors 290' and 320' are thus turned on as described above with reference to FIGS. 8 and 9 during discharge of the primary and secondary coupling capacitors 495 and 500. As a consequence, the PIN diodes 200', 205' and 210' are quickly switched to a non-conductive state since when turned on transistor 320' effectively connects the PIN diodes to the negative supply voltage −V. Hence, the switch-driver within each of the N branch arms of the switch-limiter 400 allows the common arm C to be rapidly connected to, or isolated from, the input port of a particular branch arm.

When a logical low is being impressed upon switch control node 480 so as to forward bias the PIN diodes 200', 205' and 210' and thus isolate the common arm C from the input port 120', the incidence of a high-power RF pulse does not change the operative state of the switch-limiter 400. That is, the presence of a high-power RF pulse at the input port 120' turns on the Schottky diode 180', which in turn forces a turn-on current through isolation transistor 190'. However, transistor 190' would be supplying current to PIN diodes 200', 205' and 210' via transistor 485 if a logical low were being impressed upon switch control node 480. It follows that the common arm C is isolated from the input port 120' either during incidence of a high-power RF pulse or while a logical low is applied to switch control node 480.

In contrast, when a logical high is being applied to switch control node 480 the PIN diodes 200', 205' and 210' are non-conductive and RF signal energy may propagate between the common arm C and the input port 120' along the high-frequency signal path 140'. Under this condition the incidence of a high-power RF pulse causes the switch-driver 410 to forward bias the PIN diodes 200', 205' and 210' in the manner described above with reference to the timing diagrams of FIGS. 4-9.

Table II below identifies the specific electrical components used in a preferred implementation of the switch-limiter 400, with the entries below the column heading "Ref#" corresponding to the reference numerals in FIG. 11.

TABLE II

| Ref # | Component | Manufacturer | Part # |
|---|---|---|---|
| 180' | Schottky Diode | Alpha Industries, Inc. | CDB7605 |
| 205' | PIN Limiter Diode | Alpha Industries, Inc. | CLA3133-01 |
| 200' | PIN Limiter Diode | Alpha Industries, Inc. | CLA3133-01 |
| 210' | PIN Limiter Diode | Alpha Industries, Inc. | CLA3132-01 |
| 330' | Rectifier Diode | Motorola, Inc. | 1N4001 |
| 190' | PNP Transistor | Motorola, Inc. | 2N4209 |
| 320' | NPN Transistor | Motorola, Inc. | 2N2369A |
| 290' | PNP Transistor | Motorola, Inc. | 2N4209 |
| 240' | 5K Ohm Resistor | Mini-Systems, Inc. | 110-50000F-0001 |
| 285' | 10 Ohm Resistor | Mini-Systems, Inc. | 110-10R00J-0000 |
| 295' | 2K Ohm Resistor | Mini-Systems, Inc. | 110-20000F-0001 |
| 287' | 350 Ohm Resistor | Mini-Systems, Inc. | 110-350R0F-0001 |
| 300' | 40K Ohm Resistor | Mini-Systems, Inc. | 110-40001F-0001 |
| 245' | 5K Ohm Resistor | Mini-Systems, Inc. | 110-50000F-0001 |
| 310' | 350 Ohm Resistor | Mini-Systems, Inc. | 110-350R0F-0001 |
| 225' | 18 nH Inductor | Microwave Components, Inc. | 6-1847-GA |
| 270' | 15 pF Capacitor | Dielectric Labs., Inc. | D20BG150K1PX |
| 260' | 15 pF Capacitor | Dielectric Labs., Inc. | D20BG150K1PX |
| 280' | 15 pF Capacitor | Dielectric Labs., Inc. | D20BG150K1PX |
| 275' | 15 pF Capacitor | Dielectric Labs., Inc. | D20BG150K1PX |
| 305' | 100 pF Capacitor | Dielectric Labs., Inc. | D20BG150K1PX |
| 315' | 0.1 uF Capacitor | Johanson Dielectric, Inc. | 500S41X7R104KP |
| 485 | PNP Transistor | Motorola, Inc. | 2N4209 |
| 472 | 500 Ohm Resistor | Mini-Systems, Inc. | 110-500R0F-0001 |
| 473 | 2.7K Ohm Resistor | Mini-Systems, Inc. | 110-27000F-0001 |
| 471 | 1K Ohm Resistor | Mini-Systems, Inc. | 110-10000F-0001 |
| 505 | 75 Ohm Resistor | Mini-Systems, Inc. | 110-75R00J-0000 |
| 405 | 15 pF Capacitor | Dielectric Labs., Inc. | D20BG150K1PX |
| 475 | 0.1 uF Capacitor | Johanson Dielectric, Inc. | 500S41X7R104KP |
| 490 | 50 pF Capacitor | Dielectric Labs., Inc. | D20BG500K1PX |
| 495 | 100 pF Capacitor | Dielectric Labs., Inc. | D20BG101K1PX |
| 500 | 100 pF Capacitor | Dielectric Labs., Inc. | D20BG101K1PX |

Broadband Switch-Limiter

Figure 12:
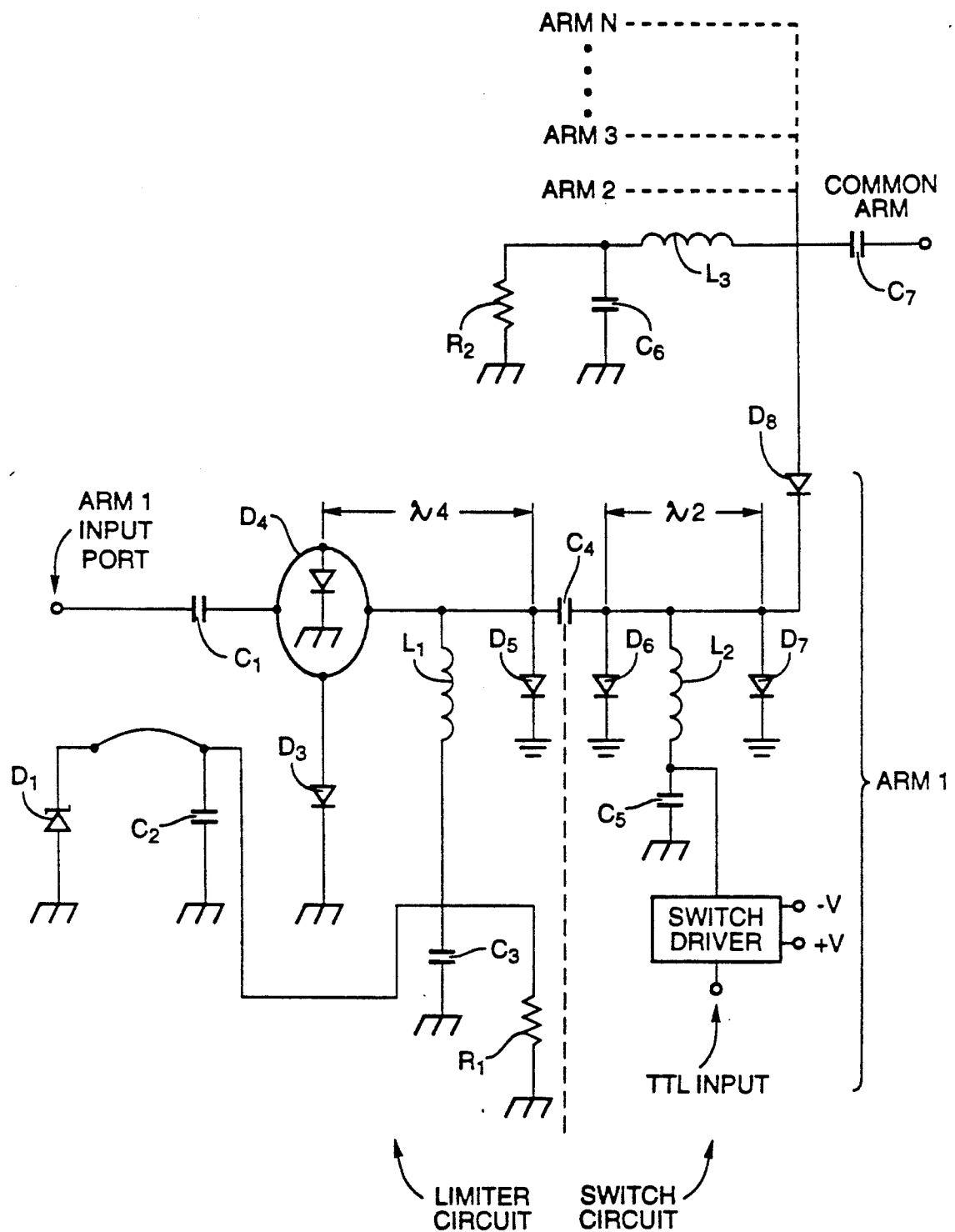
FIG. 12 shows a schematic representation of a conventional broadband switch-limiter circuit.

Referring to FIG. 12, there is shown a schematic representation of a conventional broadband switch-limiter circuit. The broadband switch-limiter of FIG. 12 includes N high-frequency signal paths (branch arms) capacitively coupled by capacitor C7 to a common arm. Since each of the N branch arms will typically be substantially identical, only a first branch arm (Arm 1) is shown in detail in FIG. 12. Each branch arm will generally be in communication with an antenna (not shown) through an input port of a limiter circuit such as that described with reference to FIG. 1.

A switch circuit included within each branch arm operates to selectively isolate the input port of the branch arm from the common arm when the appropriate control voltage +Vc is supplied by a TTL switch driver. Comparison of FIGS. 10 and 12 reveals that the quarter-wave section of transmission line present between diode D7 and the common arm within the conventional octave-band switch-limiter (FIG. 10) has been replaced by a PIN diode D8 within the broadband switch-limiter (FIG. 12). Since when reverse-biased the series-connected diode D8 provides isolation over a wider frequency band than a quarter-wave section of transmission line, the operating bandwidth of the switch-limiter of FIG. 12 is larger than that of the octave-bandwidth circuit of FIG. 10. The quarter-wave spaced PIN diodes D6 and D7 within the broadband switch-limiter serve to enhance the isolation provided at frequencies near a desired center operating frequency.

Although the conventional broadband switch-limiter circuit of FIG. 12 is capable of providing suitable isolation between the common arm and selected input ports of the branch arms over a selected bandwidth, it is noted that each branch arm includes five PIN diodes. As mentioned above, each PIN diode increases the insertion loss of the broadband switch-limiter when the switch circuit of a particular branch arm is biased so as to allow low-power RF signal energy to pass between the input port thereof and the common arm. Such insertion loss is undesirable since, for example, it attenuates the strength of low-power RF signals propagating from the input port of one of the branch arms to the common arm. As is discussed below with reference to FIG. 13, the broadband switch-limiter circuit of the present invention minimizes insertion loss by reducing the number of PIN diodes required to be incorporated within each branch arm.

Figure 13:
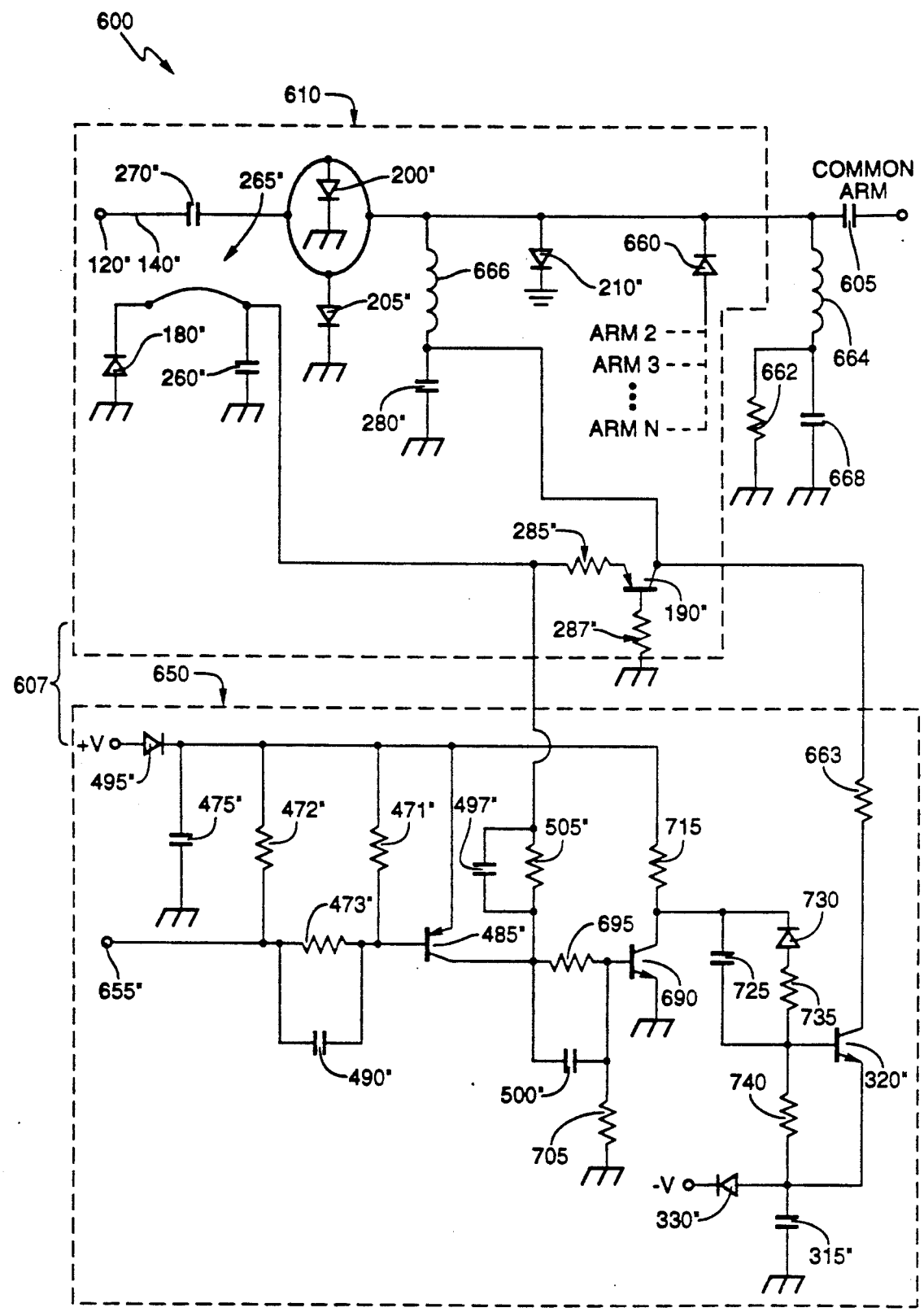
FIG. 13 is a schematic representation of a preferred embodiment of the broadband switch-limiter circuit of the present invention.

Referring to the schematic representation of FIG. 13, a preferred embodiment of the inventive broadband switch-limiter circuit 600 includes N identical branch arms coupled to a common arm by a DC-blocking capacitor 605. A first broadband branch arm 607 includes a first RF circuit 610 interposed between the common arm C and an antenna (not shown). The first branch arm 607 further includes a DC-coupled switch-driver 650, which incorporates certain of the electrical components used within the AC-coupled switch-driver 450. Accordingly, the reference numerals of FIG. 11 will be employed in conjunction with quotation marks to identify those electrical components common to the octave-band switch-limiter 400 and to the broadband switch-limiter 600.

As was described with reference to the octave-band RF circuit 410, the first RF circuit 610 included within arm 607 is disposed to perform both limiting and switching functions. The RF circuit 610 operates as a limiter by reflecting high-power RF pulses incident upon input port 120", and operates as a switch to selectively isolate input port 120" from the common arm C when switch-driver 650 when the appropriate switch control voltage is applied to a switch control node 655.

Specifically, the RF circuit 610 may be switched to the insertion loss state by applying a TTL logical high to control node 655. This causes the switch-driver 650 to impress a negative supply voltage −V upon the signal path 140", thereby turning off the shunt-connected PIN diodes 200", 205" 210". Application of a logical high (e.g., 5 V) to node 655 also turns on PIN diode 660, connected in series with the signal path 140" at the common arm, by forcing a quiescent DC bias current through a DC bias loop. The bias loop includes the PIN diode 660, first and second DC bias resistors 662 and 663, first and second RF choke inductors 664 and 666, and the transistor 320", with the first DC bias resistor 662 being connected in parallel with a bias capacitor 668. Impressing a TTL logical low upon node 655 turns on switch control transistor 485" and isolation transistor 190", which results in high-frequency short circuits being developed across PIN diodes 200", 205" and 210" as a consequence of the DC current forced therethrough. Driving node 655 with a logical low also turns off transistor 320", thereby turning off series-connected PIN diode 660 by interrupting the DC current therethrough. In this way application of a logical low to control node 655 isolates input port 120" from the common arm C. This isolation is increased at RF frequencies near a center operating frequency by virtue of the quarter-wavelength spacing between the PIN diodes 200", 205" and PIN diode 210".

Again, the RF circuit 610 is also disposed to operate as a limiter to reflect high-power RF pulse energy impinging upon the input port 120". Incidence of such a high-power pulse triggers the switch-driver 650 to place the RF circuit 610 in a limiting mode in a manner substantially similar to that described above in connection with application of a logical low to control node 655. In particular, signal path 140" is made to approximate a high-frequency open circuit by creating short circuits across the PIN diodes 200", 205" and 210" with the DC bias current from Schottky diode 180". In addition, the quiescent DC bias current through series-connected diode 660 is interrupted so as to create a high-frequency open circuit at the common arm. Hence, the switch-driver 450 allows switching and limiting functions to be implemented using a set of four PIN diodes (i.e., the shunt-connected PIN diodes 200", 205" and 210" and the series-connected PIN diode 660). It follows that the insertion loss of the inventive broadband switch-limiter 600 will be less than that of the conventional switch-limiter of FIG. 12, given that the latter requires a set of six PIN diodes.

The operation of the switch-driver 650 may be conveniently described with reference to FIG. 13. As shown in FIG. 13, the switch-driver 650 includes a voltage divider consisting of primary, secondary and tertiary divider resistors 471", 472" and 473", with the primary and secondary resistors 471" and 472" being commonly connected to a power supply capacitor 475" and power-supply protection diode 495". The control node 480" is coupled to the base of PNP switch-control transistor 485" through the parallel connection of switching capacitor 490" and the tertiary resistor 473". Application of a logical low to control node 655" turns on transistor 485" by pulling the base below the emitter thereof, since the latter is connected to a positive supply voltage +V (e.g., 5 V) through the supply diode 485". Upon being turned on, transistor 485" directly charges primary and secondary coupling capacitors 497" and 500" and turns on a DC-coupled transistor 190" through resistor 505". A second voltage divider consisting of third and fourth DC bias resistors 695 and 705 maintain transistor 690 in a non-conductive state when transistor 485" is turned off by biasing the base of transistor 690 at less than the base-emitter turn-on threshold.

Again referring to FIG. 13, the collector of DC-coupled transistor 690 is connected to the positive power supply +V through a fifth DC bias resistor 715, and is coupled to the base of transistor 320" through a second coupling capacitor 725 in parallel with Zener diode 730 and sixth DC bias resistor 735. The Zener diode 730 will generally selected to have a breakdown voltage approximately equivalent in magnitude to that of the negative power supply −V, with this voltage also being developed across capacitor 725 when transistor 690 is turned off. Hence, transistor 320" will be turned off when transistor 690 is turned on, since the drop in voltage at the collector of transistor 690 upon turn-on thereof will be mirrored at the base of transistor 320" by way of Zener diode 730. As shown in FIG. 13, pull-down resistor 740 facilitates turn-off of transistor 320" when transistor 690 is again turned on subsequent to application of a logical low to control node 655.

Again with reference to FIG. 13, raising control node 655 from a logical low to a logical high turns off transistor 485", which results in transistor 690 also being turned off as a consequence of the interruption in base drive current thereto. The rise in the collector voltage of transistor 690 upon becoming non-conductive turns on transistor 320", which allows a DC bias current to again flow through the series-connected diode 660. The actuation of transistor 320" also results in the PIN diodes 200", 205" and 210" becoming reverse-biased by connection of the negative supply voltage −V to the signal path 140" through a DC path consisting of transistor 320", resistor 663, and RF choke inductor 666. In this way application of a logical high to switch control node 655 places the RF circuit 610 in the insertion loss state wherein RF signals are allowed to propagate between the common arm C and the input port 120" with minimal attenuation. Hence, the switch-driver within each of the N branch arms of the switch-limiter 400 allows the common arm C to be rapidly connected to, or isolated from, the input port of a particular branch arm.

It is noted that when a logical low is being impressed upon switch control node 655 so as to isolate the common arm from the input port 120", the incidence of a high-power RF pulse does not change the operative state of the switch-limiter 600. That is, the effect of incidence of a high-power RF pulse upon input port 120" is to turn on isolation transistor 190", but transistor 190" will already have been turned on as a consequence of the logical low applied to switch control node 480". It follows that the common arm is isolated from the input port 120" either during incidence of a high-power RF pulse or while a logical low is applied to switch control node 655.

In contrast, when a logical high is being applied to switch control node 655 the shunt-connected PIN diodes 200", 205" and 210" are non-conductive while the series-connected PIN diode 660 is conductive. Under these conditions the RF circuit 610 is in the insertion loss state, wherein RF signal energy is allowed to propagate between the common arm and the input port 120" along the high-frequency signal path 140". The incidence of a high-power RF pulse causes the switch-driver 610 to forward bias the PIN diodes 200", 205" and 210" in the manner described above with reference to the timing diagrams of FIGS. 4–9, and also to turn off the series-connected diode 660 by interrupting its supply of DC current. In this way incidence of an RF pulse while the RF circuit 610 is in the insertion loss state causes a high-frequency open circuit to temporarily develop between the common arm and the input port 120". It is observed that high-power signals will be attenuated even in the absence of provision of the voltages −V and +V, since the PIN diodes 200", 205" and 210" are energized with current from the Schottky diode 180". Hence, the power-handling capability of the PIN diodes 200", 205" and 210" is assured of being relatively large even in the event of, for example, a power failure resulting in loss of the voltages +V and −V.

Table III below identifies the specific electrical components used in a preferred implementation of the switch-limiter 600, with the entries below the column heading "Ref#" corresponding to the reference numerals in FIG. 13.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, the switch-driver circuits disclosed herein may be implemented using MOS rather than bipolar circuit components. In addition, the teachings of the present invention may suggest to those skilled in the art related means by which quarter-wave spaced PIN diodes may be simultaneously used as a switch and as a Schottky-driven power-limiting network.

What is claimed is:

1. A high-frequency limiter circuit having an input port, an output port, and a high-frequency signal path therebetween, comprising:

input diode means for generating a bias current in response to incidence upon said input port of high-energy signals in excess of a predefined power level;

protection diode means for reflecting said high-energy signals upon being switched to an ON state by a portion of said bias current provided thereto by a bias network, said protection diode means being disposed to reflect signal energy propagated by said high-frequency signal path when in said ON state and to pass signal energy propagated by said high-frequency signal path when in an OFF state; and driver means for modifying impedance of said bias network so as to expedite switching of said protection diode means between said ON and OFF states.

TABLE III

| Ref # | Component | Manufacturer | Part # |
|---|---|---|---|
| 180" | Schottky Diode | Alpha Industries, Inc. | CDB7605 |
| 205" | PIN Limiter Diode | Alpha Industries, Inc. | CLA3133-01 |
| 200" | PIN Limiter Diode | Alpha Industries, Inc. | CLA3133-01 |
| 210" | PIN Limiter Diode | Alpha Industries, Inc. | CLA3132-01 |
| 330" | Rectifier Diode | Motorola, Inc. | 1N4001 |
| 190" | PNP Transistor | Motorola, Inc. | 2N4209 |
| 320" | NPN Transistor | Motorola, Inc. | 2N2369A |
| 285" | 10 Ohm Resistor | Mini-Systems, Inc. | 110-10R00J-0000 |
| 270" | 15 pF Capacitor | Dielectric Labs., Inc. | D20BG150K1PX |
| 260" | 15 pF Capacitor | Dielectric Labs., Inc. | D20BG150K1PX |
| 280" | 15 pF Capacitor | Dielectric Labs., Inc. | D20BG150K1PX |
| 495" | 100 pF Capacitor | Dielectric Labs., Inc. | D20BG101K1PX |
| 315" | 0.1 uF Capacitor | Johanson Dielectric, Inc. | 500S41X7R104KP |
| 485" | PNP Transistor | Motorola, Inc. | 2N4209 |
| 505" | 75 Ohm Resistor | Mini-Systems, Inc. | 110-75R00J-0000 |
| 490" | 50 pF Capacitor | Dielectric Labs., Inc. | D20BG500K1PX |
| 497" | 100 pF Capacitor | Dielectric Labs., Inc. | D20BG101K1PX |
| 500" | 100 pF Capacitor | Dielectric Labs., Inc. | D20BG101K1PX |
| 660" | PIN Beam Lead Diode | Alpha Industries, Inc. | DSM6380-18 |
| 735 | Zener Diode | Sprague Electric Co. | 1N5243B |
| 690 | NPN Transistor | Motorola, Inc. | 2N2369A |
| 662 | 500 Ohm Resistor | Mini-Systems, Inc. | 110-500R0F-0001 |
| 666 | 18 nH Inductor | Microwave Components, Inc. | 6-1847-GA |
| 671 | 500 Ohm Resistor | Mini-Systems, Inc. | 110-500R0F-0001 |
| 672 | 1K Ohm Resistor | Mini-Systems, Inc. | 110-10000F-0001 |
| 695 | 1K Ohm Resistor | Mini-Systems, Inc. | 110-10000F-0001 |
| 673 | 2K Ohm Resistor | Mini-Systems, Inc. | 110-20000F-0001 |
| 705 | 2K Ohm Resistor | Mini-Systems, Inc. | 110-20000F-0001 |
| 715 | 350 Ohm Resistor | Mini-Systems, Inc. | 110-350R0F-0001 |
| 735 | 1K Ohm Resistor | Mini-Systems, Inc. | 110-10000F-0001 |
| 740 | 1K Ohm Resistor | Mini-Systems, Inc. | 110-10000F-0001 |
| 663 | 75 Ohm Resistor | Mini-Systems, Inc. | 110-75R00J-0000 |
| 664 | 18 nH Inductor | Microwave Components, Inc. | 6-1847-GA |
| 668 | 15 pF Capacitor | Dielectric Labs., Inc. | D20BG150K1PX |
| 725 | 100 pF Capacitor | Dielectric Labs., Inc. | D20BG101K1PX |
| 605 | 15 pF Capacitor | Dielectric Labs., Inc. | D20BG150K1PX |
| 675 | 0.1 uF Capacitor | Johanson Dielectric, Inc. | 500S41X7R104KP |

2. The high-frequency limiter circuit of claim 1 wherein said driver means includes a transistor switching network for reducing said impedance of said bias network during a diode discharge interval subsequent to incidence of one of said high-energy signals upon said input port;

whereby reducing said impedance of said bias network facilitates removal of charge from said protection diode means accumulated thereby during operation in said ON state.

3. The high-frequency limiter circuit of claim 2 wherein said driver means includes:

switched transistor means for providing a low-impedance discharge path between said protection diode and a negative power supply during said discharge intervals, and an isolation transistor for isolating said input diode means from said negative power supply.

4. The high-frequency limiter circuit of claim 2 wherein protection diode means includes first and second diodes positioned along said high-frequency path, said diodes being separated by a distance of approximately $\lambda/4$ wherein $\lambda$ corresponds to a center wavelength propagated by said high-frequency path.

5. A high-frequency switch-limiter circuit, said switch-limiter circuit having at least one input port and a high-frequency signal path between said input port and a common arm, comprising:

input diode means for generating a first bias current in response to incidence upon said input port of high-energy signals in excess of a predefined power level;

protection diode means for reflecting said high-energy signals upon being switched to an ON state by a portion of said first bias current and for isolating said high-frequency signal path from said common arm when switched to said ON state by a second bias current, said protection diode means being disposed to reflect signal energy propagated by said high-frequency signal path when in said ON state and to pass signal energy propagated by said high-frequency signal path when in an OFF state; and driver means for providing said first and second bias currents to said protection diode means, said driver means further including means for modifying the impedance of a bias network included so as to expedite switching of said protection diode means between said ON and OFF states.

6. The high-frequency switch-limiter circuit of claim 5 wherein said impedance modifying means includes a transistor switching network for reducing said impedance of said bias network during a diode discharge interval subsequent to incidence of one of said high-energy signals upon said input port;

whereby reducing said impedance of said bias network facilitates removal of charge from said protection diode means accumulated thereby during operation in said ON state.

7. The high-frequency limiter circuit of claim 6 wherein said driver means includes:

switched transistor means for providing a low-impedance discharge path between said protection diode and a negative power supply during said discharge intervals, and an isolation transistor for isolating said input diode means from said negative power supply.

8. The high-frequency switch-limiter circuit of claim 7 wherein said high-frequency path comprises a microstrip transmission line, said input diode means includes a Schottky diode, and said protection diode means includes first and second PIN diodes spaced one-quarter of a center wavelength propagated by said transmission line.

9. The high-frequency switch-limiter circuit of claim 5 wherein said driver means includes a switch control network for triggering said bias network to generate said second bias current in response to a first switch control signal impressed on a control node.

10. The high-frequency switch-limiter of claim 9 wherein said switch control network includes a switch control transistor having a control terminal capacitively coupled to said control node and an output terminal capacitively coupled to said input diode means.

11. The high-frequency switch-limiter of claim 5 wherein said high-frequency signal path comprises a microstrip transmission line, and wherein said protection diode means includes a first diode positioned along said transmission line approximately $\lambda/4$ from said common arm, wherein $\lambda$ corresponds to a center wavelength propagated by said transmission line.

12. The high-frequency switch-limiter of claim 11 wherein said protection diode means includes a second diode positioned along said microstrip transmission line between said first diode and said input port wherein said first and second diodes are separated by a distance of approximately $\lambda/4$, wherein $\lambda$ corresponds to said center wavelength propagated by said transmission line.

13. A high-frequency switch-limiter circuit, said switch-limiter circuit having a plurality of high-frequency branch arms interposed between separate input ports and a common arm, comprising:

input diode means for generating a first bias current in response to incidence upon a first of said input ports of high-energy signals in excess of a predefined power level;

first protection diode means for reflecting said high-energy signals upon being switched to an ON state by a portion of said first bias current, said protection diode means being disposed to reflect signal energy propagated by a first of said high-frequency signal paths coupled to said first input port when in said ON state and to pass signal energy propagated by said first high-frequency signal path when in an OFF state;

second protection diode means for isolating said first high-frequency signal path from said common arm when driven by a second bias current; and, driver means for providing said portion of said first bias current to said first protection diode means and for providing said second bias current to said second protection diode means, said driver means including means for modifying impedance of a bias network included therein so as to expedite switching of said first protection diode means between said ON and OFF states.

14. A high-frequency switch-limiter circuit, said switch-limiter circuit having at least a first input port and a high-frequency signal path between said first input port and a common arm, comprising:

input diode means for generating a first bias current in response to incidence upon said first input port of high-energy signals in excess of a predefined power level;

a plurality of shunt-connected protection diodes connected in parallel with said high-frequency signal path for reflecting said high-energy signals upon being switched to an ON state by a portion of said first bias current;
a series-connected protection diode connected in series with said high-frequency signal path wherein said series-connected diode presents a low impedance when driven by a second bias current and a high impedance otherwise; and
driver means for modifying impedance of a bias network included therein so as to expedite switching of said shunt-connected protection diodes between said ON and OFF states, and for driving said series-connected diode with said second bias current.

15. The switch-limiter circuit of claim 14 wherein said high-frequency signal path comprises a microstrip transmission line, said series-connected diode is connected in series with said transmission line proximate said common arm, and wherein said driver means includes switch-transistor means disposed to interrupt said second bias current in response to a switch control signal.

16. In a high-frequency limiter circuit having an input port, an output port, a high-frequency signal path therebetween, and a plurality of protection diodes connected to said high-frequency signal path, a method of attenuating high-energy signals comprising the steps of:
generating a bias current in response to incidence upon said input port of high-energy signals in excess of a predefined power level by a biasing network;
reflecting said high-energy signals by providing a portion of said bias current to said plurality of protection diodes, said protection diodes being disposed to reflect signal energy propagated by said high-frequency signal path when in an ON state and to pass signal energy propagated by said high-frequency signal path when in an OFF state; and
modifying impedance of said bias network connected to said protection diodes so as to expedite switching of said protection diode means between said ON and OFF states.

17. In a high-frequency switch-limiter circuit having an input port, an output port, a high-frequency signal path therebetween, and a plurality of protection diodes connected to said high-frequency signal path, a method of attenuating high-energy signals comprising the steps of:
generating a bias current in response to incidence upon said input port of high-energy signals in excess of a predefined power level by a biasing network;
placing said protection diodes in an ON state by providing thereto a portion of said first bias current or by providing thereto a second bias current in response to a switch control signal, said protection diodes being disposed to reflect said high-energy signals propagated by said high-frequency signal path when in said ON state and to pass signal energy propagated by said high-frequency signal path when in an OFF state; and
modifying impedance of said bias network connected to said protection diodes so as to expedite switching of said protection diode means between said ON and OFF states.

* * * * *